(12) United States Patent
Engelmann et al.

(10) Patent No.: US 6,313,617 B1
(45) Date of Patent: Nov. 6, 2001

(54) CIRCUIT ARRANGEMENT FOR REDUCING VOLTAGE DRAW DOWN IN BATTERY SUPPLY LINES

(75) Inventors: Mario Engelmann, Steinbach/Ts.; Tibor Toth, Hattersheim; Werner Fritsch, Rödermark, all of (DE)

(73) Assignee: Continental Teves AG & Co., oHG, Frankfurt (DE)

( * ) Notice: Subject to any disclaimer, the term of this patent is extended or adjusted under 35 U.S.C. 154(b) by 0 days.

(21) Appl. No.: 09/529,618

(22) PCT Filed: Oct. 16, 1998

(86) PCT No.: PCT/EP98/06566

§ 371 Date: Jun. 23, 2000

§ 102(e) Date: Jun. 23, 2000

(87) PCT Pub. No.: WO99/21269

PCT Pub. Date: Apr. 29, 1999

(30) Foreign Application Priority Data

Oct. 17, 1997 (DE) .............................. 197 45 959
Aug. 18, 1998 (DE) .............................. 198 37 374

(51) Int. Cl.$^7$ ....................................... G05F 1/56
(52) U.S. Cl. ............................................. 323/285
(58) Field of Search ................................. 323/282, 285

(56) References Cited

U.S. PATENT DOCUMENTS

| 4,504,779 | | 3/1985 | Mandelcorn | 327/175 |
|---|---|---|---|---|
| 5,600,234 | * | 2/1997 | Hastings et al. | 323/282 |
| 5,612,610 | * | 3/1997 | Borghi et al. | 323/285 |
| 5,629,610 | * | 5/1997 | Pedrazzini et al. | 323/285 |
| 5,739,711 | | 4/1998 | Haman | 323/349 |
| 5,912,552 | * | 6/1999 | Tateishi | 323/285 |
| 5,986,902 | * | 11/1999 | Brkovic et al. | 323/285 |
| 6,064,187 | * | 5/2000 | Redl et al. | 323/285 |
| 6,100,677 | * | 8/2000 | Farrenkopf | 323/282 |
| 6,130,528 | * | 10/2000 | Aoyama | 323/282 |

FOREIGN PATENT DOCUMENTS

| 32 33 536 | 4/1984 | (DE) | G05B/11/16 |
|---|---|---|---|
| 33 12 108 | 10/1984 | (DE) | G05B/11/38 |
| 43 29 917 | 3/1995 | (DE) | G05F/1/46 |
| 41 34 056 | 4/1992 | (DE) | G05F/1/56 |
| 297 15 925 | 12/1997 | (DE) | G05F/1/56 |
| 198 08 297 | 9/1998 | (DE) | G05F/1/56 |
| 35 08 187 | 9/1986 | (DE) | H01F/7/18 |
| 41 40 586 | 1/1994 | (DE) | H01F/7/18 |
| 43 41 797 | 6/1995 | (DE) | H01F/7/18 |
| 41 39 720 | 5/1993 | (DE) | H02M/3/156 |
| 0 849 753 | 6/1998 | (EP) | H01H/47/32 |

\* cited by examiner

*Primary Examiner*—Jeffrey Sterrett
(74) *Attorney, Agent, or Firm*—Rader, Fishman & Grauer PLLC

(57) ABSTRACT

The present invention relates to a method and apparatus for reducing voltage sags in the battery supply lines of the circuit arrangement which is used to regulate or control the current input of a consumer in an automotive vehicle, wherein the consumer current is regulated or controlled by pulse-width modulation (PWM) and a controllable switch is used. To this end, a circuit is used which influences the edges of a pulse-width modulated signal, and a signal representative of the rate of change in the current in the battery supply lines to the consumer is produced. This signal is fed back to the input signal by way of a capacitor.

12 Claims, 3 Drawing Sheets

CIRCUIT ARRANGEMENT FOR REDUCING VOLTAGE DRAW DOWN IN BATTERY SUPPLY LINES

TECHNICAL FIELD

The present invention generally relates to voltage regulators and more particularly relates to a method of reducing voltage draw down in the battery supply lines of a circuit arrangement which is used to regulate or control the current supplied to a power consumption device in an automotive vehicle.

BACKGROUND OF THE INVENTION

A method and a circuit arrangement for regulating or controlling the current input of a consumer in an automotive vehicle is known and customary in the art, according to which a regulation or control of the actuation of a controllable switch is effected in a pulse-width modulated (PWM) regulation or control, wherein connected in series with the consumer is the controllable switch, and wherein the pulse-width modulated regulation or control of the current input of the consumer is effected by a corresponding signal being applied to the control connection of the controllable switch. The regulation or control of the current input occurs by way of the switch-on time of the controllable switch which may be configured as a field effect transistor, for example. The consumer in the automotive vehicle may e.g. be a booster, a magnetic valve, or any other consumer.

U.S. Pat. No. 4,504,779 discloses a mains supply unit wherein the speed of current variations is changed in order to overcome electromagnetic interference (EMI) problems. By means of the electronic circuit, the voltage for a consumer is controlled in that the input signal and the control voltages are controlled for a high limit and a low limit for a controllable switch. Further, DE-A-41 34 056 discloses a method for the redundant control of a current regulator.

An object of the present invention is to minimize voltage draw down in battery supply lines which are due, for example, to the switching of currents during a control operation by means of pulse-width modulation and can cause radiation of interfering signals.

This object is achieved by the present invention, wherein a circuit is used which influences the edges of a pulse-width modulated signal, in that a signal representative of the change in the current in the battery supply lines to the consumer is produced and fed back to the input signal of the circuit (negative feedback).

The emitted radiation of interfering signals is reduced by improving the current variation in the battery supply lines. It is then possible to use a much smaller electrolytic capacitor to support the batter) voltage. Further, the signal variation of the current that flows through the consumer is improved.

The resistance of the controllable switch will not change abruptly but within a certain length of time. This length of time is comparatively short and depends on the magnitude of the actuation signal. With a strong actuation signal (current or voltage), the resistance of the controllable switch changes very quickly. Current surges may then occur when switching on and off. Therefore, the intensity of the actuation signal is advantageously varied in response to the time variation of the current. Thus, the positive variation of the current is fed back to the actuation signal upon switching on so that the actuation signal is reduced. The length of time during which the controllable switch becomes conductive is therefore extended. On switching off, the negative variation of the current is fed back to the actuation signal. The decline in the actuation signal is therefore reduced. The length of time during which the controllable switch passes from the conductive condition into the non-conductive condition is therefore extended.

In a preferred embodiment, the signal representative of the current in the battery supply lines to the consumer is determined by means of a shunt resistor.

Because the current edge in the supply lines shall be regulated, a quantity derived from this current can be used for negative feedback by means of this resistor. A current measuring resistance to ground is the most inexpensive solution.

In a preferred embodiment, the consumer is an inductive consumer. In addition, a signal representative of the change in the voltage drop across the inductive consumer is fed back to the actuation signal.

When the controllable switch is switched off, the voltage edge lies in front of the current edge to be regulated and overcoming it causes overamplification of the current control. With the current edge then occurring, the control must move from overamplification back to the operating range which takes a length of time that should not be left out of account.

A preferenced circuit for implementing the method of the present invention which includes a circuit for influencing the edges of a pulse-width modulated signal, by which a signal which is representative of the change in the current in the battery supply lines to the consumer is produced and fed back to the input signal of the circuit by delivering the signal which is representative of the current in the battery supply lines to the input signal of the circuit by way of a capacitor.

It is achieved that the time variation of the signal can be sensed and fed back without a highly complex circuitry, by the employment of the capacitor.

The signal representative of the current received by the consumer is determined by means of a shunt resistor.

In a preferred embodiment, the consumer is an inductive consumer, and, in addition, a signal representative of the variation of the voltage drop across the inductive consumer is fed back to the actuation signal by delivering the signal representative of the voltage drop across the inductive consumer to the input signal of the circuit by way of a capacitor.

This has proved advantageous inasfar as no current change prevails directly upon start of a switching operation. No correction variable is fed back to the actuation signal. Thus, small current surges may occur in particular directly before switching on or off. Favorably, the variation of the voltage drop across the inductive consumer is fed back in addition. The voltage drop across the inductive consumer is basically determined by the time variation of the current according to the law of induction.

Thus, negative feedback of the time variation of the voltage drop corresponds to a negative feedback of a signal which represents the second time derivative of the current. It is thus possible to very quickly vary the actuation signal in relation to current changes.

DETAILED DESCRIPTION OF THE PREFERRED EMBODIMENTS

Figure 1:
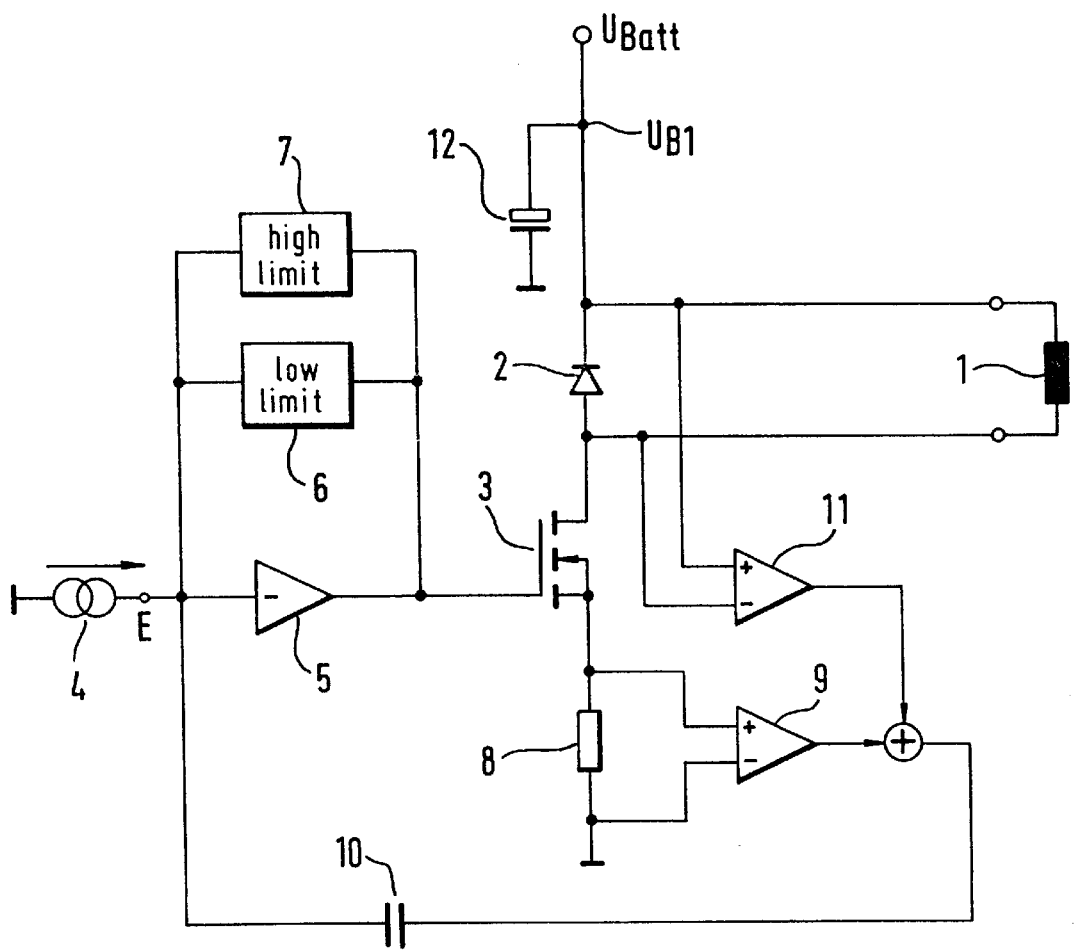
FIG. 1 is a circuit arrangement.

FIG. 1 shows a circuit for reducing voltage sags (i.e. draw down) in a pulse-width modulated regulation or control of the current input of a consumer 1 in an automotive vehicle. This consumer 1 may be the coil of a magnetic valve in a brake system of an automotive vehicle, for example. Connected in parallel to consumer 1 is a Schottky diode 2 as a freewheeling diode in order that the current induced in the inductive consumer 1 during switching off can continue to flow.

Further, a controllable switch 3 can be seen which is a field effect transistor in the circuit arrangement of FIG. 1.

This field effect transistor 3 is actuated by means of a current source 4 in the circuit arrangement of FIG. 1. The current which flows from this current source into the gate of the field effect transistor 3 causes a voltage between gate and drain due to capacitive effects, with the result that the field effect transistor 3 becomes conductive. The current supplied by the current source 4 flows across the capacitor during the edges, otherwise across the limiters 6 and 7, depending upon whether the consumer 1 is in the ON or OFF state. Limiters 6 and 7 are means which define a top and a bottom limit of the current. They ensure that the current flows off from the current source 4 at the end of the edge and can no longer charge or discharge the capacitor 10. This causes the inverter 5 to always remain in the linear range, and the control will respond immediately at a rapid rate when the next edge comes.

The actuation of the field effect transistor 3 is used to control or regulate the on-time of this field effect transistor 3 and, thus, the current input of the consumer 1.

Further, the provision of a shunt resistor 8 can be taken from the circuit of FIG. 1. The voltage which drops across shunt 8 is measured by means of an amplifier 9 and fed back to the input of the circuit by way of a capacitor 10.

In addition, it has proved favorable to determine the voltage which drops across the inductive consumer 1 by way of another amplifier 11 and to also feed it back to the input signal E by way of the capacitor. This permits avoiding major current changes or steep edges immediately at the commencement of the on-times and at the commencement of the off-times.

Further, an electrolytic capacitor 12 is provided to filter the battery voltage $U_{Batt}$ on the supply lines. It is advantageous that a relatively small electrolytic capacitor is sufficient owing to the employment of the circuit of the present invention which flattens the edges.

It is of course possible to effect negative feedback of the signals of the amplifiers 9 and 11 by way of different capacitors. This permits adjustment of the intensity of negative feedback of both signals at a different rate. When a large-size capacitor is used, the result is a correspondingly stronger negative feedback, which causes flatter edges in the current variation, while the current variation is accordingly steeper when small-size capacitors are used.

Also, different degrees of negative feedback can be covered by different amplifications of the amplifiers 9 and 11. When an integrated circuit is implemented, the capacitor is sized to be as small as possible.

Beside the size of the capacitor 10, of course, the current variation itself is also included in the control. In case the current signal in the shunt resistor 8 changes very quickly, the differential effect of capacitor 10 causes a corresponding augmentation of the negative feedback compared to a flatter current change.

The degree of the negative feedback or current edge steepness is defined by the values of capacitor 10 in a combination with the current I furnished by the gate actuation.

Figure 2:
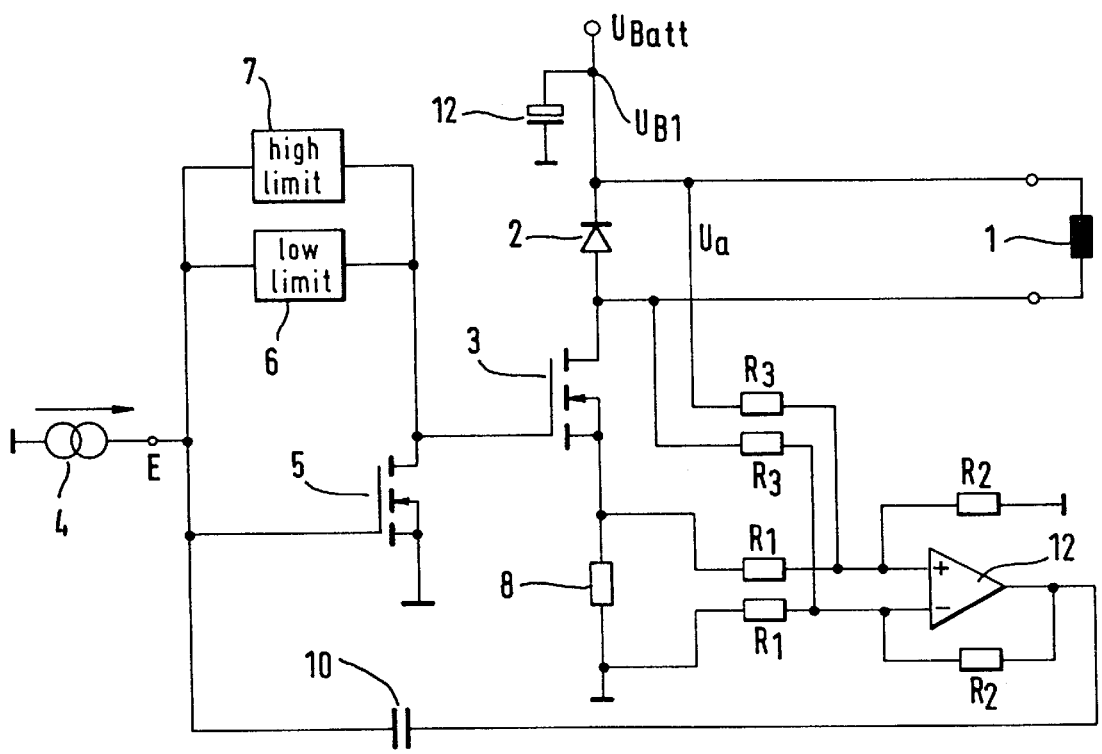
FIG. 2 is another embodiment of a circuit arrangement.
Figure 3:
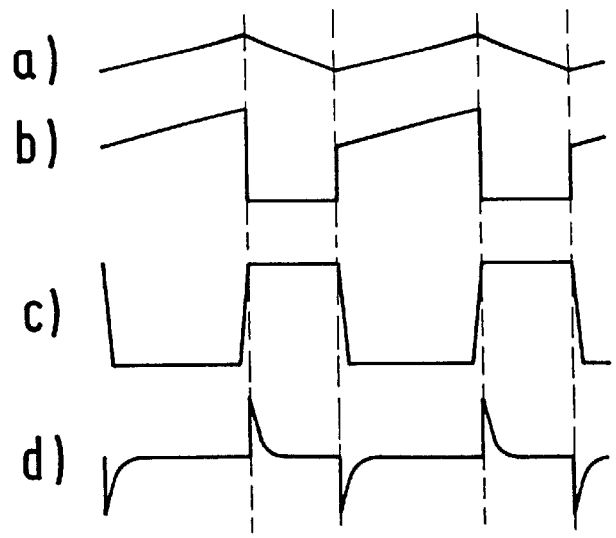
FIG. 3 shows signal variations of the current without negative feedback.

Another favorable embodiment of the circuit arrangement can be seen in FIG. 2 when the summation point is positioned in front of the amplifiers. It becomes apparent that this obviates the need for one of the amplifiers. Only amplifier 12 remains in this case. Different degrees of negative feedback may be achieved by a different weighting in the summation point. The inverter 5 is also configured as a field effect transistor in this embodiment.

FIGS. 3a to 3d and FIGS. 4a to 4d show in each case on top of one another:

a) the variation of the current in consumer 1 which is a coil in the present case.

b) the current in the supply line to the consumer 1 and, thus, also in the shunt resistor 8.

c) the drain voltage on the field effect transistor 3.

d) the operating voltage of the circuit downstream of the supply lines (UB1).

The representations of FIGS. 3a to 3d show the conditions without the negative feedback of the present invention, and in FIGS. 4a to 4d the conditions with the negative feedback of the signal measured on the shunt resistor 8 are shown.

It shows that due to negative feedback, the steepness of the current edges and of the voltage edges in the supply line is greatly reduced.

The electrolytic capacitor 12 may be provided, for example, to limit the steep edges.

Figure 4:
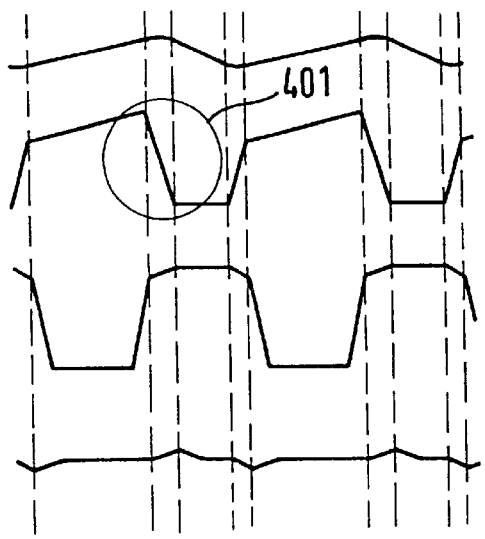
FIG. 4 shows signal variations of the current with negative feedback.
Figure 5:
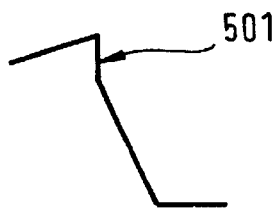
FIG. 5 is a detail view of the signal variation of FIG. 3.

FIG. 5 shows an enlarged view of the detail 401 of FIG. 4. The enlarged detail view of the current switch-off edge at first glance shows a current change 501 that is still very rapid. This small step in the current function becomes even more apparent in the high-frequency interference spectrum. The step is due to the initially insufficient negative feedback of the amplifier 9 which senses the current in the shunt resistor 8. The reason herefor is the control circuit which has been driven into saturation beforehand.

This is why, advantageously, there is provision of the further amplifier 11. The voltage across the consumer 1 is sensed and fed back differentially by means of this amplifier. Because consumer 1 is an inductive consumer, the voltage is proportional to the current change. Because this signal is again fed back differentially, a signal which corresponds to the second derivative of the current as a function of time is fed back, thereby safeguarding a quick reaction time of the control. This means that, as a whole, it is detected at a quicker rate that the current flow is interrupted and that the field effect transistor 3 switches off. Further, a sufficiently great signal amplitude is available in order to induce the necessary correction variable in the gate control current I.

The explanations given with respect to the amplifiers 9 and 11 accordingly apply to the actuations of amplifier 12 in FIG. 2.

Figure 6:
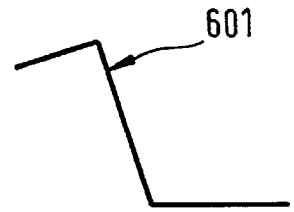
FIG. 6 is a detail view of the signal variation of the Figure with an improved negative feedback.

FIG. 6 shows the corresponding detail where it can be seen at location 601 that the steep edge in the current variation has disappeared.

In the circuit arrangement shown, there is no need for the amplifier 11, however, the "stairstep" shown in the drawing must be tolerated in this case. When it is possible to dimension the capacitor 10 at a sufficient rate (for example, in an implementation in discrete circuit technology), one may even omit the amplifier 9 by connecting capacitor 10 directly to the current measuring resistor 8.

What is claimed is:

1. A circuit arrangement for regulating a current to a consumer in an automotive vehicle, the circuit arrangement comprising:

a current source for providing an input signal to the circuit arrangement, the input signal being regulated by pulse-width modulation;

a resister connected in series with the consumer;

a first amplifier for measuring a voltage across the resistor and for providing a first signal;

a second amplifier for measuring a voltage across the consumer and for providing a second signal; and a series-coupled capacitor coupling the first and second amplifiers with the input signal of the circuit arrangement to provide a negative feedback signal to the input signal of the circuit arrangement, thereby changing a shape of the input signal of the circuit arrangement.

2. The circuit arrangement according to claim 1, wherein the negative feedback signal corresponds to a second derivative of the current through the consumer as a function of time.

3. The circuit arrangement according to claim 1, wherein the consumer is an inductive consumer and the voltage drop across the consumer corresponds to a time rate of change of the current through the consumer.

4. The circuit arrangement according to claim 1, wherein the capacitor allows adjustment of the negative feedback signal.

5. The circuit arrangement according to claim 1, wherein the consumer comprises a coil.

6. A method of reducing voltage draw down in a supply line of a circuit arrangement for regulating a current to a consumer in an automotive vehicle, the current being regulated by pulse-width modulation, the method comprising the steps of:

providing an input signal to the circuit arrangement;

determining a voltage drop across a resister connected in series with the consumer by means of a first amplifier;

determining a voltage across the consumer by means of a second amplifier; and providing a negative feedback signal by means of a series-coupled capacitor coupling the first and second amplifiers with the input signal of the circuit arrangement, whereby a shape of the input signal is changed by the negative feedback signal being provided to the input signal of the circuit arrangement.

7. A circuit arrangement for regulating a current to a consumer in an automotive vehicle, the circuit arrangement comprising:

a current source for providing an input signal to the circuit arrangement, the input signal being regulated by pulse-width modulation;

a resister connected in series with the consumer;

an amplifier for measuring a voltage across the resistor and the consumer; and a series-coupled capacitor coupling the amplifier with the input signal of the circuit arrangement to provide a negative feedback signal to the input signal of the circuit arrangement, thereby changing a shape of the input signal of the circuit arrangement.

8. The circuit arrangement according to claim 7, wherein the negative feedback signal corresponds to a second derivative of the current through the consumer as a function of time.

9. The circuit arrangement according to claim 7, wherein the consumer is an inductive consumer and the voltage drop across the consumer corresponds to a time rate of change of the current through the consumer.

10. The circuit arrangement according to claim 7, wherein the capacitor allows adjustment of the negative feedback signal.

11. The circuit arrangement according to claim 7, wherein the consumer comprises a coil.

12. A method of reducing voltage draw down in a supply line of a circuit arrangement for regulating a current to a consumer in an automotive vehicle, the current being regulated by pulse-width modulation, the method comprising the steps of:

providing an input signal to the circuit arrangement;

determining a voltage drop across a resister connected in series with a consumer by means of an amplifier; and providing a negative feedback signal by means of a series-coupled capacitor coupling the amplifier with the input signal of the circuit arrangement, whereby a shape of the input signal is changed by the negative feedback signal being provided to the input signal of the circuit arrangement.

\* \* \* \* \*